(12) United States Patent
Ogura et al.

(10) Patent No.: US 9,741,872 B2
(45) Date of Patent: Aug. 22, 2017

(54) SEMICONDUCTOR DEVICE

(71) Applicant: Kabushiki Kaisha Toshiba, Minato-ku, Tokyo (JP)

(72) Inventors: Tsuneo Ogura, Kamakura Kanagawa (JP); Tomoko Matsudai, Shibuya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/846,551

(22) Filed: Sep. 4, 2015

(65) Prior Publication Data
US 2016/0276498 A1 Sep. 22, 2016

(30) Foreign Application Priority Data
Mar. 16, 2015 (JP) .................. 2015-052420

(51) Int. Cl.
*H01L 29/66* (2006.01)
*H01L 29/868* (2006.01)
(Continued)

(52) U.S. Cl.
CPC ........ *H01L 29/868* (2013.01); *H01L 29/0684* (2013.01); *H01L 29/66136* (2013.01);
(Continued)

(58) Field of Classification Search
CPC ..... H01L 21/823487; H01L 21/823821; H01L 21/823885; H01L 27/11273
(Continued)

(56) References Cited

U.S. PATENT DOCUMENTS 5,969,400 A * 10/1999 Shinohe .............. H01L 27/0761
257/170
9,087,893 B2 * 7/2015 Onishi ................ H01L 29/0634
(Continued)

FOREIGN PATENT DOCUMENTS

JP 2010-067901 A 3/2010
JP 2010-073857 A 4/2010
(Continued)

OTHER PUBLICATIONS

Korean Office Action issued on Aug. 23, 2016 in counterpart Korean patent application No. 10-2015-0113040, along with an English translation thereof.

*Primary Examiner* — Tan N Tran
(74) *Attorney, Agent, or Firm* — White & Case LLP

(57) ABSTRACT

According to one embodiment, a semiconductor device includes a first electrode, a second electrode, a first semiconductor region, a second semiconductor region, a third semiconductor region, and a fourth semiconductor region. The first semiconductor region is provided between the first and second electrodes. The second semiconductor region is provided between the first semiconductor region and the second electrode. The third semiconductor region is provided between the first semiconductor region and the second electrode, is provided beside the second semiconductor region in a second direction crossing a first direction from the first electrode toward the second electrode, and a portion of the first semiconductor region is positioned between the third and second semiconductor regions. The fourth semiconductor region is provided between the portion of the first semiconductor region and the second electrode and has a greater impurity concentration than the second and third semiconductor regions.

19 Claims, 13 Drawing Sheets

(51) Int. Cl.
*H01L 29/06* (2006.01)
*H01L 29/739* (2006.01)
*H01L 29/861* (2006.01)
*H01L 29/872* (2006.01)
*H01L 29/36* (2006.01)
*H01L 29/16* (2006.01)
*H01L 29/20* (2006.01)

(52) U.S. Cl.
CPC ........ *H01L 29/7395* (2013.01); *H01L 29/861* (2013.01); *H01L 29/8613* (2013.01); *H01L 29/872* (2013.01); *H01L 29/1608* (2013.01); *H01L 29/2003* (2013.01); *H01L 29/36* (2013.01)

(58) Field of Classification Search
USPC ........ 257/135, 220, 242, 263, 302, 328, 329
See application file for complete search history.

(56) References Cited

U.S. PATENT DOCUMENTS

| | | | |
|---|---|---|---|
| 2007/0170436 A1* | 7/2007 | Sugawara | H01L 29/0615 257/77 |
| 2013/0001639 A1 | 1/2013 | Iwasaki et al. | |
| 2013/0221401 A1 | 8/2013 | Ogura et al. | |
| 2014/0061875 A1 | 3/2014 | Ogura et al. | |
| 2014/0124832 A1 | 5/2014 | Ogura et al. | |
| 2015/0263148 A1 | 9/2015 | Ogura et al. | |
| 2015/0263149 A1 | 9/2015 | Ogura et al. | |

FOREIGN PATENT DOCUMENTS

| | | |
|---|---|---|
| KR | 10-2012-0115529 A | 10/2012 |
| WO | 2011-024214 A1 | 3/2011 |

* cited by examiner

SEMICONDUCTOR DEVICE

CROSS-REFERENCE TO RELATED APPLICATIONS

This application is based upon and claims the benefit of priority from Japanese Patent Application No. 2015-052420, filed on Mar. 16, 2015; the entire contents of which are incorporated herein by reference.

FIELD

Embodiments described herein relate generally to a semiconductor device.

BACKGROUND

As a semiconductor device used in an inverter and other power converter, there are an IGBT (insulated gate bipolar transistor), a diode, and other devices. The diode is typically used for reflux and connected to an IGBT in parallel thereto but in the opposite orientation. The diode is therefore called an FWD (free wheeling diode).

To improve characteristics of an inverter and other power converters, it is important to improve characteristics of the FWD concurrently with characteristics of the IGBT. The characteristics to be improved include an ON-state voltage (voltage drop in conducting state), recovery time (annihilation time of recovery current at the time of reverse recovery), a safe operation region at the time of recovery (operation region where device is not broken even when voltage is applied in a state in which reverse recovery current flows), current/voltage oscillation at the time of recovery, and other parameters. Among them, it is important to shorten the recovery time. In the following description, the reverse recovery is called recovery.

DETAILED DESCRIPTION

Figure 1A:
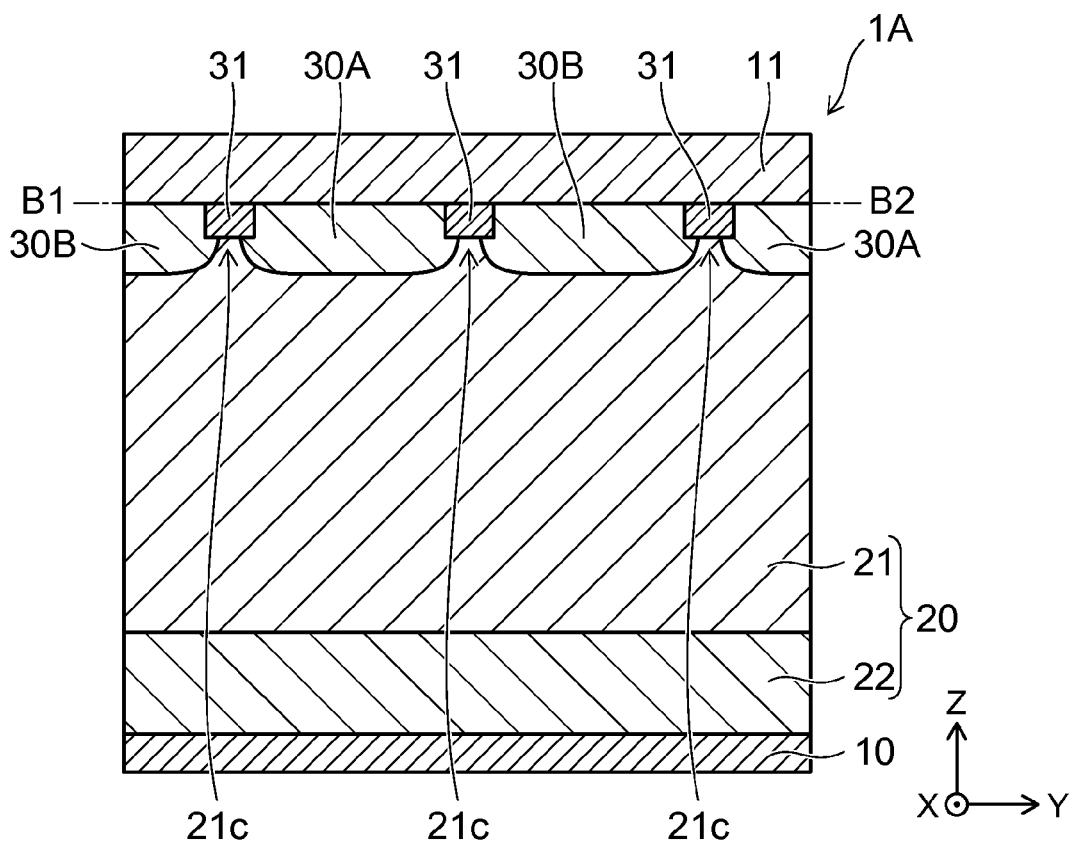
FIG. 1A is a schematic cross-sectional view showing a semiconductor device according to a first embodiment.

According to one embodiment, a semiconductor device includes a first electrode, a second electrode, a first semiconductor region of a first conductivity type, a second semiconductor region of a second conductivity type, a third semiconductor region of the second conductivity type, and a fourth semiconductor region of the second conductivity type. The first semiconductor region is provided between the first electrode and the second electrode. The second semiconductor region is provided between the first semiconductor region and the second electrode. The third semiconductor region is provided between the first semiconductor region and the second electrode, is provided beside the second semiconductor region in a second direction that crosses a first direction from the first electrode toward the second electrode, and a portion of the first semiconductor region is located between the third semiconductor region and the second semiconductor region. The fourth semiconductor region is provided between the portion of the first semiconductor region and the second electrode and has an impurity concentration greater than an impurity concentration in the second semiconductor region and an impurity concentration in the third semiconductor region.

Embodiments will be described hereinafter with reference to the accompanying drawings. In the following description, the same member has the same reference character, and a member having been described once will not be described as appropriate. In the embodiments, an n-type (first conductivity type) impurity concentration decreases in the order of an $n^+$-type, an n-type, and an $n^-$-type. Further, three-dimensional coordinates (X-axis, Y-axis, and Z-axis) are introduced in the drawings in some cases.

First Embodiment

Figure 1B:
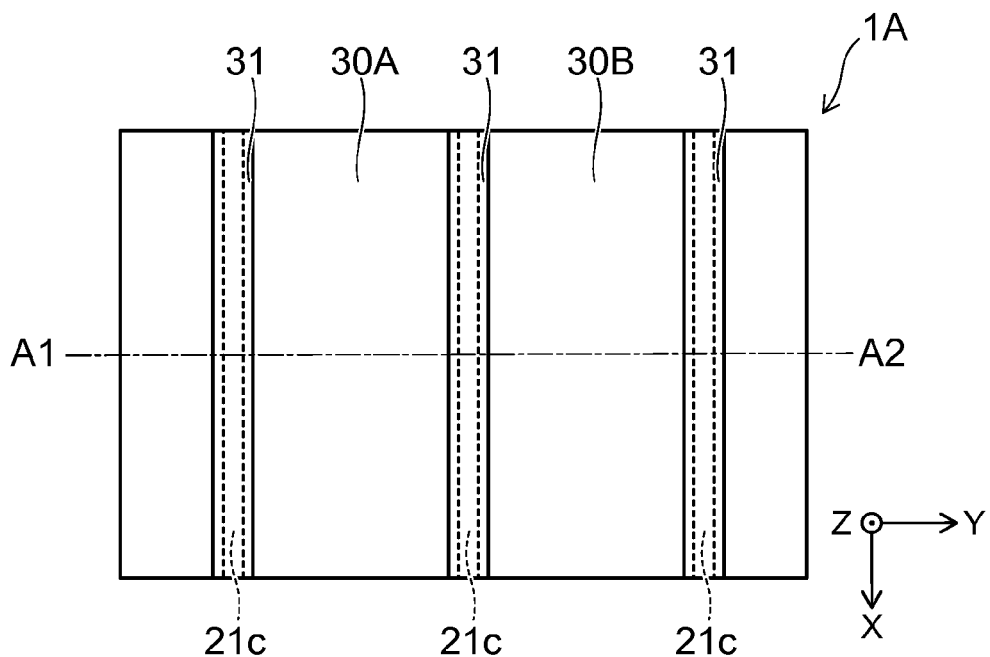
FIG. 1B is a schematic plan view showing the semiconductor device according to the first embodiment.

FIG. 1A is a schematic cross-sectional view showing a semiconductor device according to a first embodiment. FIG. 1B is a schematic plan view showing the semiconductor device according to the first embodiment. FIG. 1A shows a cross section taken along the line A1-A2 in FIG. 1B. FIG. 1B shows a cross section taken along the line B1-B2 in FIG. 1A and shows a plane of the semiconductor device.

A semiconductor device 1A is a kind of pin (p-intrinsic-n) diode. The semiconductor device 1A is used, for example, as a free wheeling diode in an inverter circuit or any other circuit.

The semiconductor device 1A according to the first embodiment includes a first electrode (for example, cathode electrode 10 in the following description), a second electrode (for example, anode electrode 11 in the following description), a first semiconductor region (for example, semiconductor region 20 in the following description), a second semiconductor region (for example, p-type semiconductor regions 30A in the following description), a third semiconductor region (for example, p-type semiconductor regions 30B in the following description), and a fourth semiconductor region (for example, $p^+$-type semiconductor regions 31 in the following description).

In the embodiment, a first direction oriented from the cathode electrode 10 toward the anode electrode 11 is called a Z direction, and a second direction that crosses the Z direction is called a Y direction. An X direction crosses the Z direction and the Y direction.

The semiconductor region 20 is provided between the cathode electrode 10 and the anode electrode 11. The semiconductor region 20 has an n-type semiconductor region 21 and an $n^+$-type semiconductor region 22. In the embodiment, the n-type semiconductor region 21 and the $n^+$-type semiconductor region 22 are collectively referred to as the semiconductor region 20 in some cases. The $n^+$-type semiconductor region 22 is connected to the cathode electrode 10. The $n^+$-type semiconductor region 22 is, for example, in ohmic contact with the cathode electrode 10. The $n^+$-type semiconductor region 22 is in contact with the n-type semiconductor region 21. The term "connection" used herein includes direct connection and indirect connection.

An n-type buffer layer (not shown) may be provided between the n-type semiconductor region 21 and the $n^+$-type semiconductor region 22. The impurity concentration in the n-type buffer layer is set, for example, at a middle value between the impurity concentration of the n-type semiconductor region 21 and the impurity concentration of the $n^+$-type semiconductor region 22.

The "impurity concentration" used herein refers to an effective concentration of an impurity element that contributes to the conductivity of a semiconductor material. For example, when a semiconductor material contains an impurity element that serves as a donor and an impurity element that serves as an acceptor, the concentration of activated impurity elements is used as the effective impurity concentration. Here, the effective impurity concentration is corresponding to the concentration that cancellation of donor and acceptor is subtracted from the concentration of donor or accepter. Further, the concentration of electrons or holes each of which is released from an ionized effective impurity element is referred to as a carrier concentration.

Whether the impurity concentration according to the embodiment is high or low is determined by comparison with a maximum or average concentration of an impurity concentration profile in the Z direction.

The p-type semiconductor regions 30A are provided between the n-type semiconductor region 21 and the anode electrode 11. The p-type semiconductor regions 30A are connected to the anode electrode 11 and the n-type semiconductor region 21. The p-type semiconductor regions 30A are in ohmic or Schottky contact with the anode electrode 11.

The p-type semiconductor regions 30B are provided between the n-type semiconductor region 21 and the anode electrode 11. The p-type semiconductor regions 30B are connected to the anode electrode 11 and the n-type semiconductor region 21. The p-type semiconductor regions 30B are in ohmic or Schottky contact with the anode electrode 11.

One of the p-type semiconductor regions 30B is provided beside the p-type semiconductor region 30A in the Y direction. The p-type semiconductor region 30B and the p-type semiconductor region 30A sandwich a portion of the n-type semiconductor region 21 (for example, channel region 21c in the following description) in the Y direction. That is, the channel region 21c is located between the p-type semiconductor region 30A and the p-type semiconductor region 30B. The channel region 21c of the n-type semiconductor region 21 is provided between the p-type semiconductor region 30B and the p-type semiconductor region 30A in the Y direction.

One of the $p^+$-type semiconductor regions 31 is provided between the channel region 21c of the n-type semiconductor region 21 and the anode electrode 11. The $p^+$-type semiconductor region 31 is connected to the anode electrode 11. The $p^+$-type semiconductor region 31 is in ohmic contact with the anode electrode 11. The $p^+$-type semiconductor region 31 extends in the X direction or partially extends in the X direction. The impurity concentration in the $p^+$-type semiconductor region 31 differs from the impurity concentration in the p-type semiconductor region 30A and the impurity concentration in the p-type semiconductor region 30B.

The $p^+$-type semiconductor region 31 is in contact with the channel region 21c of the n-type semiconductor region 21, the p-type semiconductor region 30A, and the p-type semiconductor region 30B. The p-type semiconductor region 30A, the p-type semiconductor region 30B, and the $p^+$-type semiconductor region 31 extend in the X direction.

In the Y direction, the width of the $p^+$-type semiconductor region 31 is narrower than the width of the p-type semiconductor region 30A and the width of the p-type semiconductor region 30B. The $p^+$-type semiconductor region 31 and the p-type semiconductor regions 30A and 30B are formed by implanting a p-type impurity into the n-type semiconductor region 21 and by annealing the n-type semiconductor region 21 into which the p-type impurity is implanted. The distance between the $p^+$-type semiconductor region 31 and the cathode electrode 10 is greater than the distance between the p-type semiconductor region 30A and the cathode electrode 10 and the distance between the p-type semiconductor region 30B and the cathode electrode 10. For example, the distance between the lower end of the $p^+$-type semiconductor region 31 and the upper end of the cathode electrode 10 is greater than the distance between the lower end of the p-type semiconductor region 30A and the upper end of the cathode electrode 10 and the distance between the lower end of the p-type semiconductor region 30B and the upper end of the cathode electrode 10.

The semiconductor region 20, the p-type semiconductor regions 30A and 30B, and the $p^+$-type semiconductor region 31 are primarily made, for example, of silicon (Si). The semiconductor region 20, the p-type semiconductor regions 30A and 30B, and the $p^+$-type semiconductor region 31 may be primarily made of at least one of a silicon carbide (SiC), a gallium nitride (GaN), or any other material. The impurity element of $n^+$-type, n-type, and other conductivity types (first conductivity type) is, for example, at least one of phosphorous (P), arsenide (As), or any other element. The impurity element of $p^+$-type, p-type, and other conductivity types (second conductivity type) is, for example, at least one of boron (B) or any other element.

The $n^+$-type semiconductor region 22 has a maximum impurity concentration higher than $3 \times 10^{17}$ cm$^{-3}$, for example, not lower than $1 \times 10^{18}$ cm$^{-3}$. The impurity concentration of the n$^+$-type semiconductor region 22 may be adjusted so that the impurity concentration increases toward the cathode electrode 10. The impurity concentration of the n-type semiconductor region 21 is, for example, not higher than to $1 \times 10^{15}$ cm$^{-3}$ and can be adjusted at an arbitrary impurity concentration in accordance with breakdown voltage design of the device. One of the p-type semiconductor regions 30A and 30B has a maximum impurity concentration, for example, not higher than $1 \times 10^{18}$ cm$^{-3}$. The p$^+$-type semiconductor region 31 has a maximum impurity concentration higher than $3 \times 10^{17}$ cm$^{-3}$, for example, not lower than $1 \times 10^{19}$ cm$^{-3}$. The p-type impurity concentrations may be adjusted so that the p-type impurity concentrations increase toward the anode electrode 11.

The material of one of the cathode electrode 10 and the anode electrode 11 is, for example, a metal including at least one selected from the group consisting of aluminum (Al), titanium (Ti), nickel (Ni), tungsten (W), gold (Au), and other elements.

The operation and effect of the semiconductor device 1A will be described.

Figure 2A:
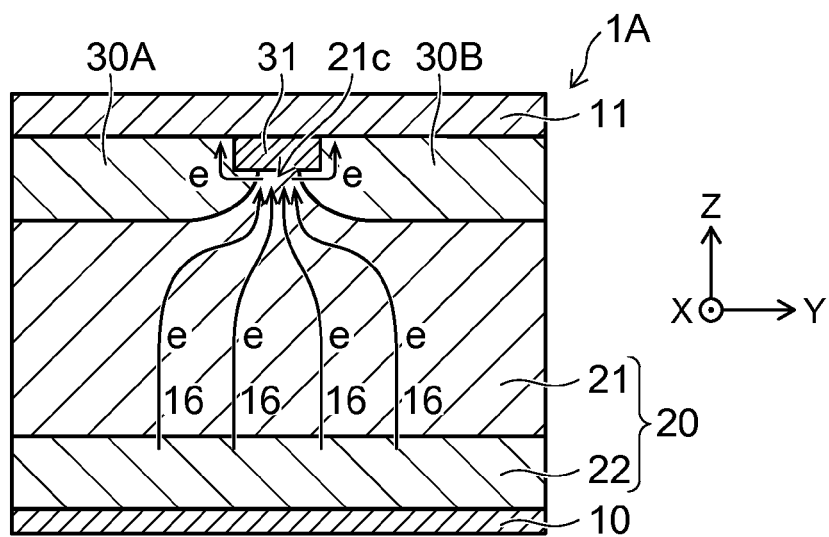
FIG. 2A and FIG. 2B are schematic cross-sectional views showing ON-state operation of the semiconductor device according to the first embodiment.
Figure 2B:
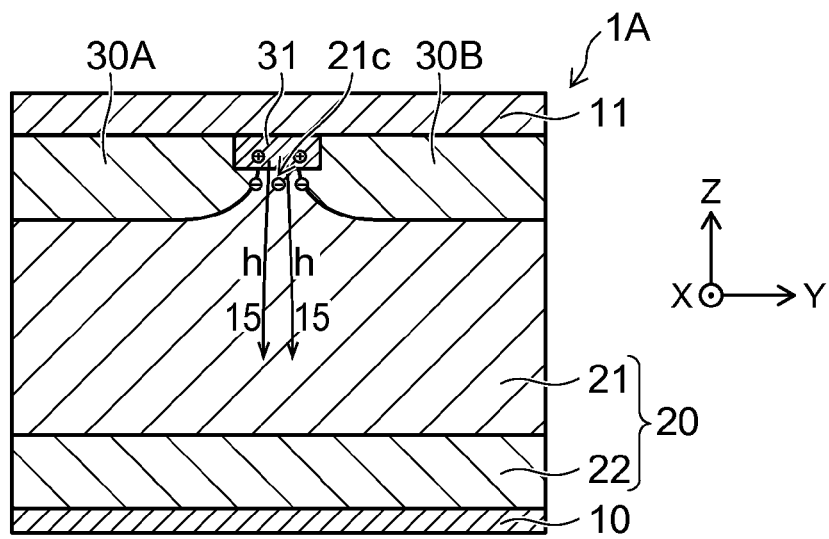
Figure 2C:
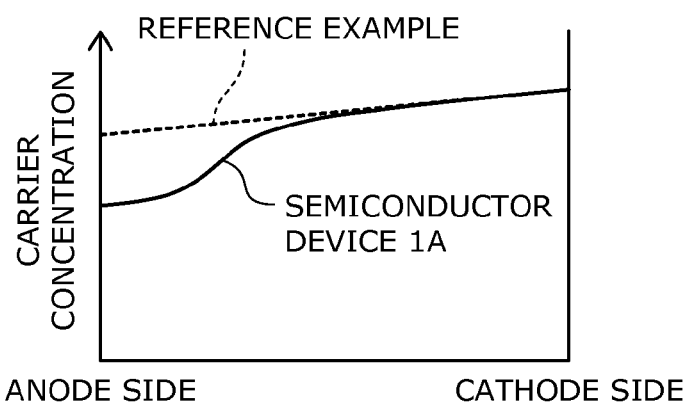
FIG. 2C shows a carrier concentration distribution in the ON-state semiconductor device according to the first embodiment and an ON-state semiconductor device according to a reference example.

FIG. 2A and FIG. 2B are schematic cross-sectional views showing ON-state operation of the semiconductor device according to the first embodiment. FIG. 2C shows a carrier concentration distribution in the ON-state semiconductor device according to the first embodiment and an ON-state semiconductor device according to a reference example.

Electron current flowing from the cathode side to the anode side will be described with reference, for example, to FIG. 2A.

In the ON state, forward-bias voltage is applied between the cathode and the anode. That is, the voltage is applied between the cathode and the anode so that the cathode electrode 10 has higher potential than the anode electrode 11. For example, the anode electrode 11 is a positive electrode, and the cathode electrode 10 is a negative electrode.

It is noted that the n$^+$-type semiconductor region 22 is in ohmic contact with the cathode electrode 10. Most electrons (e) therefore move from the n$^+$-type semiconductor region 22 via the n-type semiconductor region 21 and reach a portion immediately under the p-type semiconductor regions 30A and 30B.

The channel regions 21c is an n-type region. Therefore, the electrons do not exceed the energy barrier between the n-type semiconductor region 21 and the p-type semiconductor regions 30A, 20B, but flow through the low-potential channel region 21c toward the anode electrode 11, as shown in FIG. 2A.

The p-type semiconductor regions 30A and 30B are in resistive or Schottky contact with the anode electrode 11. That is, the contact is resistive or Schottky contact between a p-type semiconductor and a metal. As a result, the junction between the p-type semiconductor regions 30A, 30B and the anode electrode 11 serves as an energy barrier for holes (h) but does not serve as the energy barrier for the electrons (e). Then, the electrons are discharged via the p-type semiconductor regions 30A and 30B into the anode electrode 11.

As described above, the electrons (e) move through the n$^+$-type semiconductor region 22, the n-type semiconductor region 21, the channel region 21c, and the p-type semiconductor regions 30A and 30B, and the electrons (e) flow into the anode electrode 11. Thus, electron current 16 comes to be formed between the cathode and the anode.

As described above, the junction between the p-type semiconductor regions 30A, 30B and the anode electrode 11 does not serve as an energy barrier for the electrons (e), but the junction between the p$^+$-type semiconductor region 31, which is a p-type high-concentration region, and the channel region 21c serves as an energy barrier for the electrons (e). Therefore, the electrons (e), which reach immediately under the p$^+$-type semiconductor region 31, are unlikely to flow into the p$^+$-type semiconductor region 31. After the electrons (e) reached immediately under the p$^+$-type semiconductor region 31, the electrons (e) move in a lateral direction, that is, in a direction roughly parallel to the Y direction under the p$^+$-type semiconductor region 31. The Y direction in this case includes the +Y direction and the −Y direction.

Next, FIG. 2B shows hole current flowing from the anode side to the cathode side at the time of forward bias.

The movement of the electrons (e) produces a voltage drop under the p$^+$-type semiconductor region 31. The voltage drop causes biasing in such a way that the p$^+$-type semiconductor region 31, which is in contact with the anode electrode 11, is charged with a positive charge, and that the center of the channel region 21c, which is positioned under the p$^+$-type semiconductor region 31, is charged with a negative charge against the p$^+$-type semiconductor region 31, for example.

The biasing lowers the energy barrier for the holes between the channel region 21c and the p$^+$-type semiconductor region 31. As a result, the holes (h) are injected from the p$^+$-type semiconductor region 31 into the channel region 21c. The injected holes (h) form hole current 15.

The hole current 15 increases with the width of the p$^+$-type semiconductor region 31 in the Y direction or the X direction or the area where the p$^+$-type semiconductor region 31 and the anode electrode 11 are in contact with each other. In other words, the amount of holes injected from the anode side is adjusted by the width or the contact area.

In the semiconductor device 1A, the electrons flow into the anode electrode 11 via the channel regions 21c. If the electrons are injected from the n-type semiconductor region 21 into the p-type semiconductor regions 30A and 30B without moving through the channel regions 21c, the electron injection causes hole injection from the p-type semiconductor regions 30A and 30B into the n-type semiconductor region 21. In the semiconductor device 1A, in which the electrons are caused to flow into the anode electrode 11 via the channel regions 21c, the hole injection is reliably suppressed.

FIG. 2C shows impurity concentration distributions. The reference example is, for example, a pin diode with no channel region 21c. That is, the pin diode has no channel region 21c, and the lower end of the p$^+$-type semiconductor regions 31 is covered with the p-type semiconductor region 30A (or p-type semiconductor region 30B).

The carrier concentration on the anode side is lower in the first embodiment than in the reference example. FIG. 2C shows that the amount of hole injection from the p-type semiconductor regions 30A and 30B decreases in the first embodiment because the electrons injected from the cathode side flow into the anode electrode 11 via the n-type channel regions 21c.

As described above, in the ON state, holes flow from the anode side to the cathode side, and electrons flow from the cathode side to the anode side. On the anode side, the holes are injected from the p$^+$-type semiconductor regions 31, whereas the amount of holes injected from the p-type semiconductor regions 30A and 30B is small, which means that the p-type semiconductor regions 30A and 30B primarily contribute to the electron discharge. In the semiconductor device 1A, the recovery speed thereof therefore increases.

Recovery operation of the semiconductor device 1A and an effect thereof will next be described.

Figure 3A:
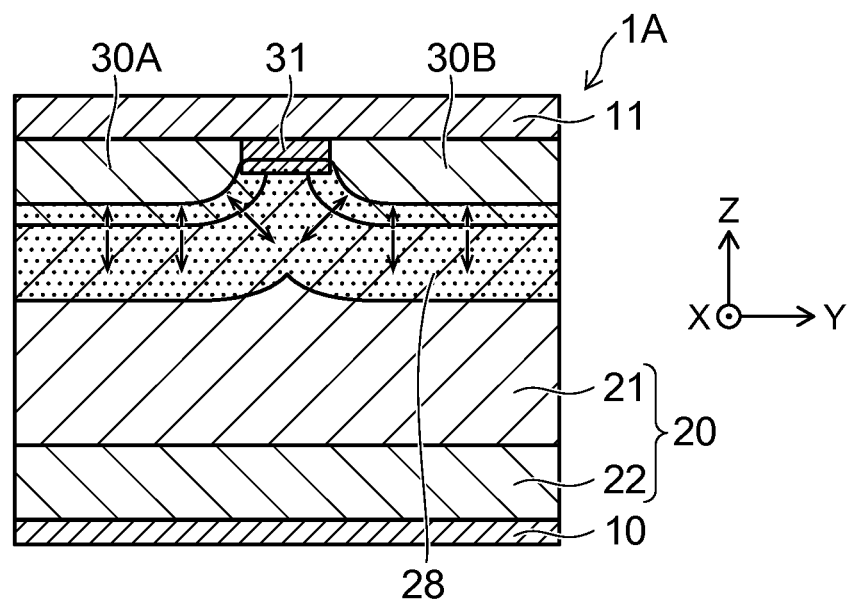
FIG. 3A and FIG. 3B are schematic cross-sectional views showing the operation of the semiconductor device according to the first embodiment in a recovery state.
Figure 3B:
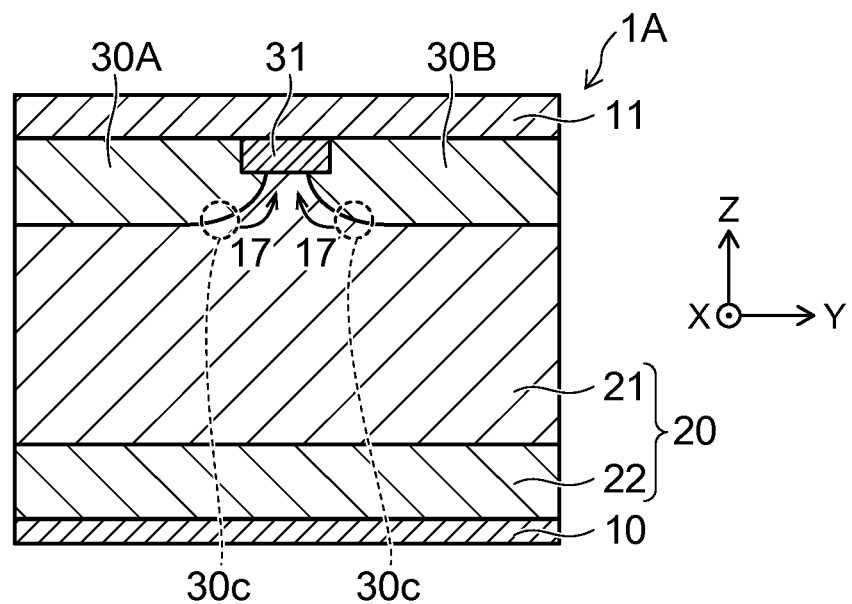

FIG. 3A and FIG. 3B are schematic cross-sectional views showing the operation of the semiconductor device according to the first embodiment in a recovery state.

FIG. 3A shows that a state that the state in which forward bias is applied between the anode and the cathode changes to a recovery state in which reverse bias is applied between the anode and the cathode. In the description, the voltage is applied between the cathode and the anode so that the anode electrode 11 is a negative electrode and the cathode electrode 10 is a positive electrode.

When the state in which forward bias is applied between the anode and the cathode changes to the state in which reverse bias is applied between the anode and the cathode, the holes (h) presented in the n-type semiconductor region 21 move toward the anode electrode 11. On the other hand, the electrons (e) presented in the n-type semiconductor region 21 move toward the cathode electrode 10.

In this process, the electrons (e) flow into the cathode electrode 10 via the $n^+$-type semiconductor region 22. On the other hand, the holes (h) flow into the anode electrode 11 via the $p^+$-type semiconductor regions 31.

At the time of recovery, in the state in which the electrons flow toward the cathode electrode 10 and the holes flow toward the anode electrode 11, a depletion layer 28 starts from the junction of the p-type semiconductor regions 30A, 30B and the n-type semiconductor region 21 or the junction of the $p^+$-type semiconductor regions 31 and the n-type semiconductor region 21, and the depletion layer 28 extends into the n-type semiconductor region 21, the p-type semiconductor regions 30A and 30B, and the $p^+$-type semiconductor regions 31. As a result, the electric conduction between the anode electrode 11 and the cathode electrode 10 in the semiconductor device 1A is gradually cut-off.

The channel regions 21c, whose width is narrow in the Y direction, are completely depleted. Therefore, in the semiconductor device 1A, reverse current (leakage current) is reliably suppressed when the reverse bias is applied. To completely deplete the channel regions 21c, the width of the channel regions 21c immediately under the $p^+$-type semiconductor regions 31 is desirably sufficiently narrow, for example, 10 µm or smaller. The width of the channel regions 21c is referred to be the length of the junction of the $p^+$-type semiconductor region 31 and the n-type semiconductor region 21 in the Y direction.

It is, however, noted that in a pin diode, electric field concentration typically occurs in a portion in the vicinity of the p-n junction at the time of recovery, resulting in an avalanche in some cases. In the first embodiment, since the holes (h) flow into the anode electrode 11 via the $p^+$-type semiconductor regions 31, a harmful effect caused by the avalanche is suppressed, whereby a safe operation region at the time of recovery is enlarged.

FIG. 3B shows the operation of the semiconductor device 1A at the time of recovery.

For example, one of the p-type semiconductor regions 30A and 30B has a corner 30c, which faces the cathode electrode 10. An electric field tends to concentrate at the corner 30c at the time of recovery. An avalanche therefore tends to occur in the vicinity of the corner 30c. A flow of holes (h) produced by the avalanche is called avalanche current 17. The avalanche current 17 is then discharged into the anode electrode 11 via the $p^+$-type semiconductor region 31 in the vicinity of the corner 30c.

The corner 30c is provided at a plurality of locations. In the semiconductor device 1A, since an avalanche tends to occur at each of the plurality of corners 30c, the locations where the avalanche occurs are scattered across the device. The avalanche current also therefore flows in a scattered manner in the vicinities of the plurality of corners 30c. The avalanche current is then discharged into the anode electrode 11 via the plurality of $p^+$-type semiconductor regions 31. Then, the amount of breakage resistance of the semiconductor device 1A at the time of recovery increases.

Further, the channel regions 21c in the semiconductor device 1A are readily formed by selectively implanting a p-type impurity into the n-type semiconductor region 21 to reverse the conductivity type of the n-type semiconductor region 21 and form the p-type semiconductor regions 30A and 30B and the $p^+$-type semiconductor regions 31 in the anode-side n-type semiconductor region 21.

As described above, the semiconductor device 1A according to the first embodiment allows not only an increase in the recovery speed but also an increase in the amount of breakage resistance at the time of recovery, that is, enlargement of the safe operation region.

Another Example of First Embodiment

Figure 4:
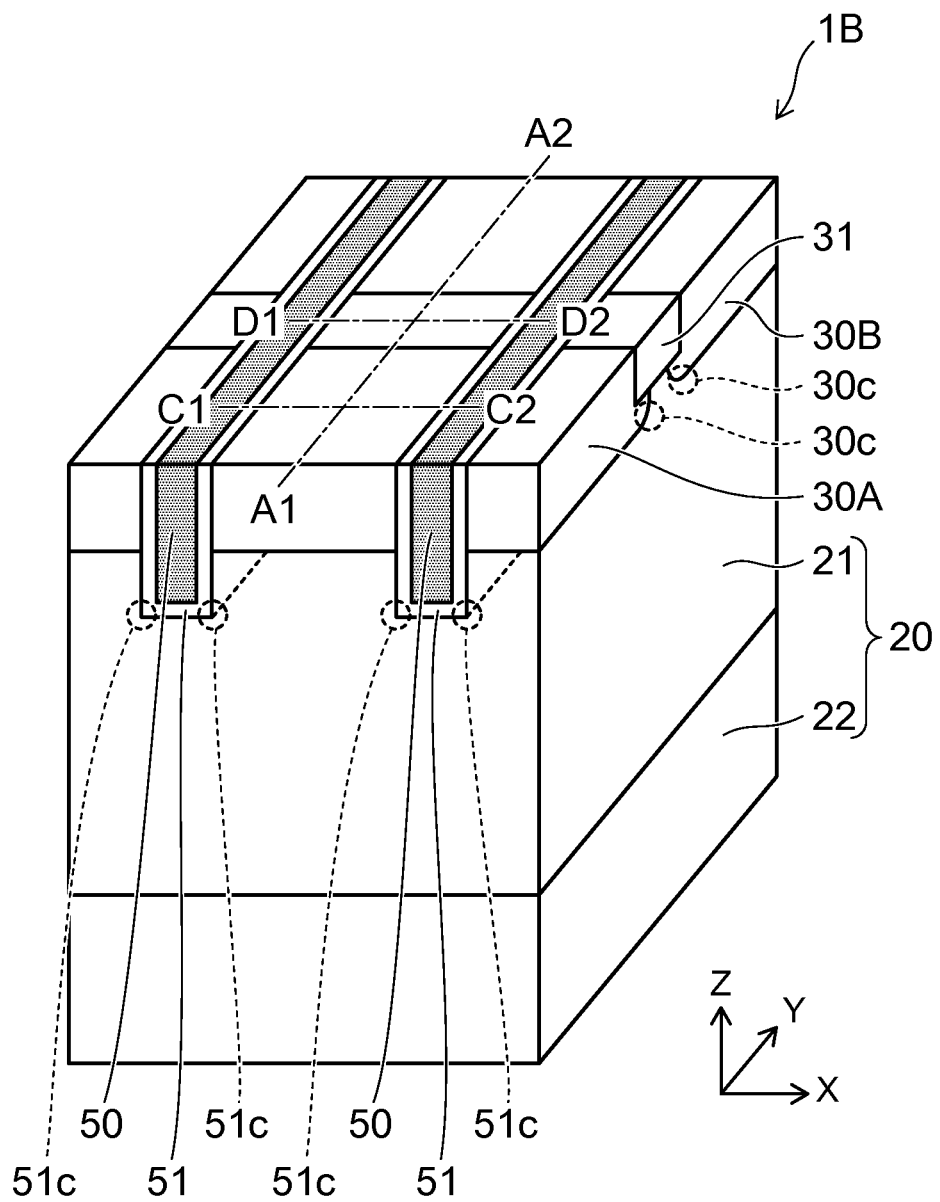
FIG. 4 is a schematic perspective view showing a semiconductor device according to a variation of the first embodiment.
Figure 5A:
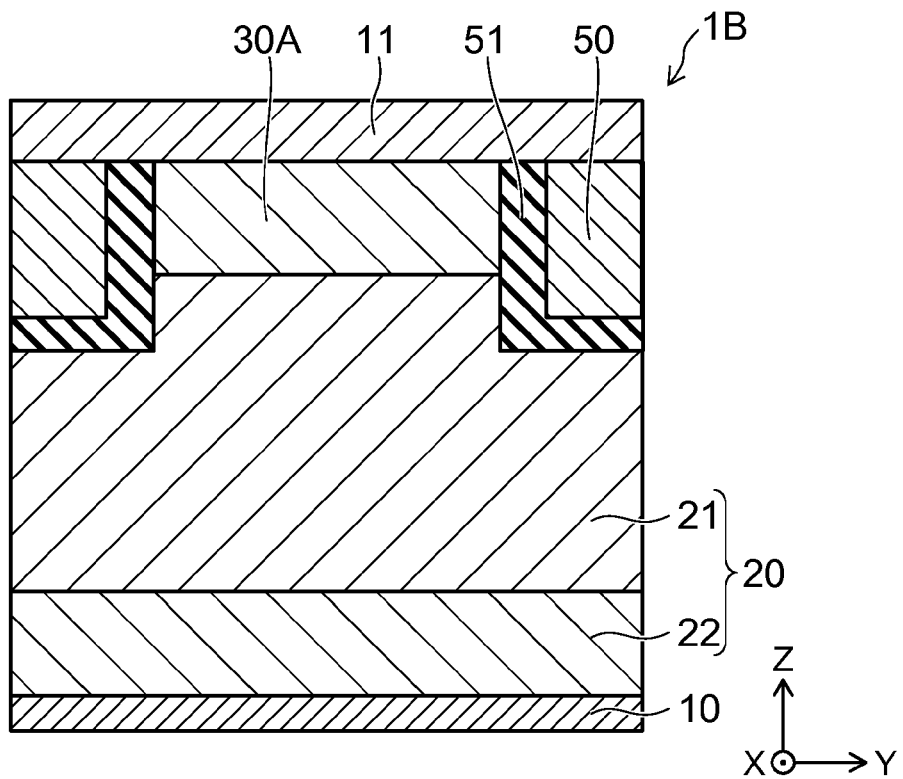
FIG. 5A and FIG. 5B are schematic cross-sectional views showing the semiconductor device according to the variation of the first embodiment.
Figure 5B:
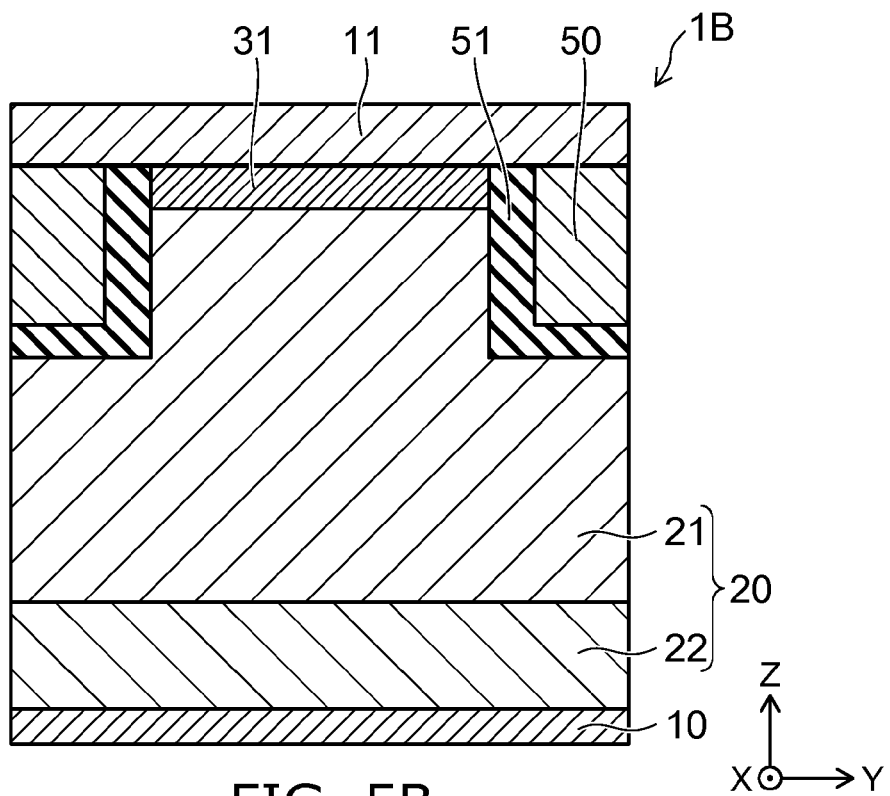

FIG. 4 is a schematic perspective view showing a semiconductor device according to a variation of the first embodiment. FIG. 5A and FIG. 5B are schematic cross-sectional views showing the semiconductor device according to the variation of the first embodiment.

FIG. 4 does not show the cathode electrode 10 or the anode electrode 11. FIG. 5A shows a cross section taken along a Z-X plane including the line C1-C2 in FIG. 4. FIG. 5B shows a cross section taken along a Z-X plane including the line D1-D2 in FIG. 4. A cross section taken along a Z-Y plane including the line A1-A2 in FIG. 4 is shown, for example, in FIG. 2A.

A semiconductor device 1B includes connection regions 50, which are connected to the anode electrode 11. One of the connection regions 50 faces the n-type semiconductor region 21, the p-type semiconductor regions 30A, the p-type semiconductor regions 30B, and the $p^+$-type semiconductor regions 31 via an insulating film 51. The connection region 50 and the insulating film 51 extend in the Y direction. The connection region 50 and the insulating film 51 are provided at a plurality of locations and arranged in the X direction. The distance between the insulating films 51 and the cathode electrode 10 is smaller than the distance between the p-type semiconductor regions 30A and the cathode electrode 10 and the distance between the p-type semiconductor regions 30B and the cathode electrode 10. For example, the distance between the lower ends of the insulating films 51 and the upper end of the cathode electrode 10 is smaller than the distance between the lower ends of the p-type semiconductor regions 30A and the upper end of the cathode electrode 10 and the distance between the lower ends of the p-type semiconductor regions 30B and the upper end of the cathode electrode 10. The connection regions 50 include, for example, polysilicon. The insulating films 51 includes, for example, a silicon oxide or a silicon nitride.

One of the insulating films 51 has a corner 51c, which face the cathode electrode 10. The corner 51c is provided at a plurality of locations. An electric field tends to concentrate at each of the corners 51c at the time of recovery. As a result, an avalanche tends to occur in the vicinity of each of the corners 51c.

In the semiconductor device 1B, in which an avalanche tends to occur not only at each of the plurality of corners 30c but also at each of the plurality of corners 51c, the locations where the avalanche occurs are further scattered across the device, whereby the amount of breakage resistance of the semiconductor device 1B at the time of recovery further increases.

Further, when the semiconductor device 1B is formed, for example, on a single wafer on which a device, such as a MOSFET (metal oxide semiconductor field effect transistor) or an IGBT (insulated gate bipolar transistor), is formed, the connection regions 50 and the insulating films 51 can be formed simultaneously with the gate electrode and the gate insulating film of the device in a formation process of the gate electrode and the gate insulating film.

Second Embodiment

Figure 6A:
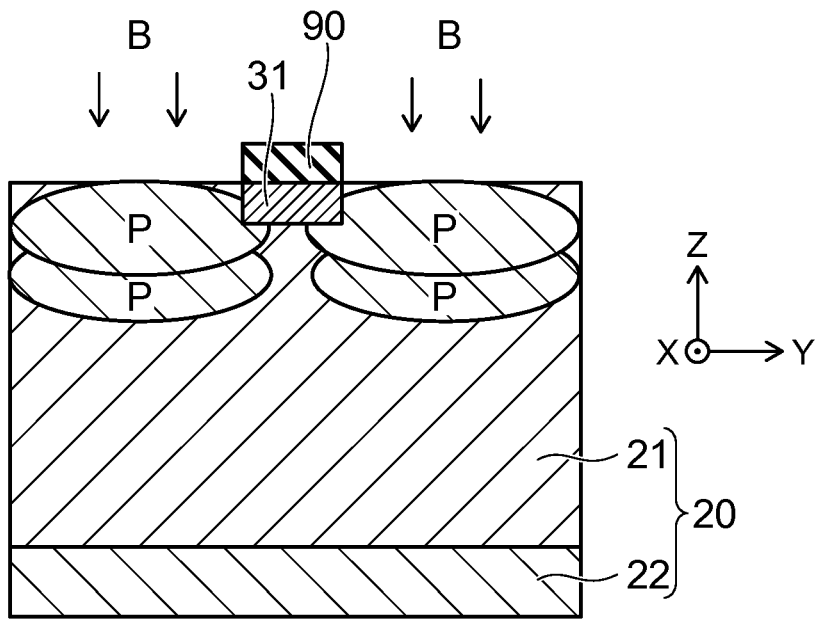
FIG. 6A and FIG. 6B are schematic cross-sectional views showing manufacturing process of a semiconductor device according to a second embodiment.
Figure 6B:
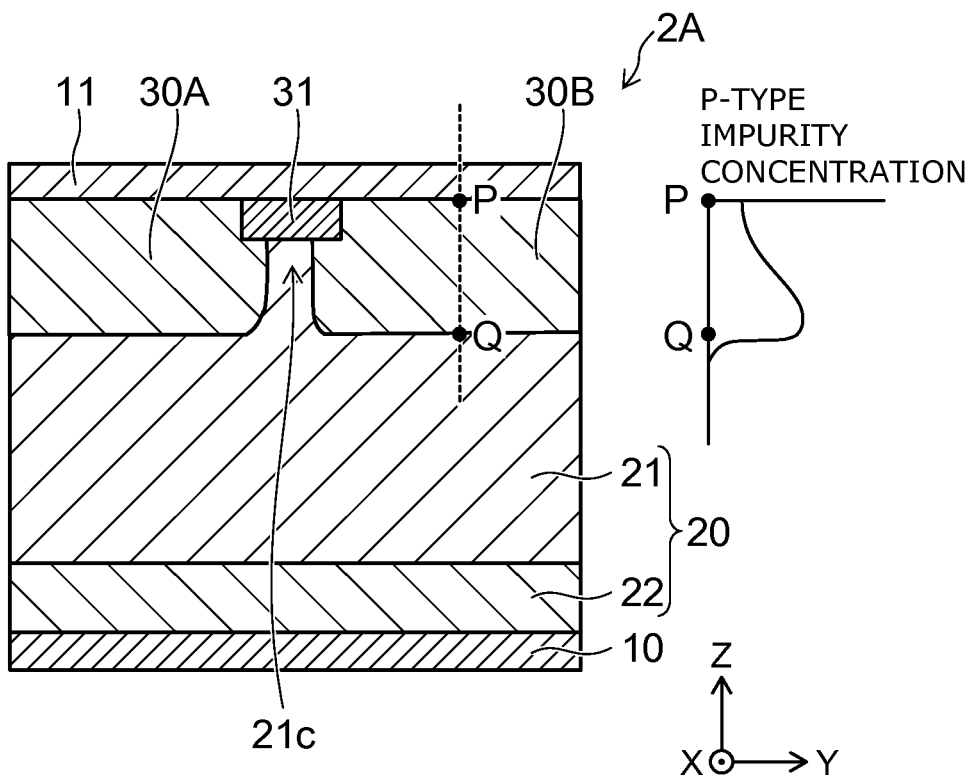

FIG. 6A and FIG. 6B are schematic cross-sectional views showing manufacturing process of a semiconductor device according to a second embodiment.

For example, after the $p^+$-type semiconductor regions 31 are formed on the surface of the n-type semiconductor region 21, a mask layer 90 is formed on each of the $p^+$-type semiconductor regions 31, as shown in FIG. 6A. A p-type impurity, such as boron (B), is then implanted in the form of ion into the surface of the n-type semiconductor region 21 that is exposed through the mask layers 90.

The ion implantation is performed multiple times. For example, the energy for accelerating the ion is changed whenever the p-type impurity is implanted in the form of ion into the surface of the n-type semiconductor region 21. The higher the energy for accelerating the ion is, the deeper the p-type impurity is implanted into the n-type semiconductor region 21. After the ion implantation, a heat treatment for activating the p-type impurity is performed. The heat treatment is, for example, flash annealing or RTA (rapid thermal annealing). FIG. 6B shows a thus formed semiconductor device 2A having undergone the heat treatment.

In the second embodiment, the multiple-time ion implantation performed at changed acceleration energy and the heat treatment for activating the p-type impurity prevent diffusion of the p-type impurity in a lateral direction (diffusion in X or Y direction) but allow formation of deep p-type semiconductor regions 30A and 30B. In other words, the channel regions 21c, which are located between the deep p-type semiconductor regions 30A and 30B, is reliably formed.

Further, employing the multiple-time ion implantation performed at the changed acceleration energy allows the p-type impurity concentration distribution in the Z direction to be arbitrarily set. An example of the profile of the p-type impurity concentration between a position P and a position Q is shown, for example, in a right side of FIG. 6B.

In the profile, the impurity concentration in the p-type semiconductor regions 30B is lower on the side of electrode 11 than on the side of the cathode electrode 10. The impurity concentration in the p-type semiconductor regions 30A is equal to the impurity concentration in the p-type semiconductor regions 30B.

As a result, in the ON state, the electrons (e) pass through the junction of the p-type semiconductor regions 30A, 30B and the channel region 21c in the vicinity of each of the $p^+$-type semiconductor regions 31 more readily. The reason why is that the closer to the anode side, the lower the potential barrier between the p-type semiconductor regions 30A, 30B and the channel region 21c for the electrons (e). As a result, hole injection from the p-type semiconductor regions 30A and 30B is suppressed, whereby the recovery speed of the semiconductor device 2A increases.

Another Example of Second Embodiment

Figure 7:
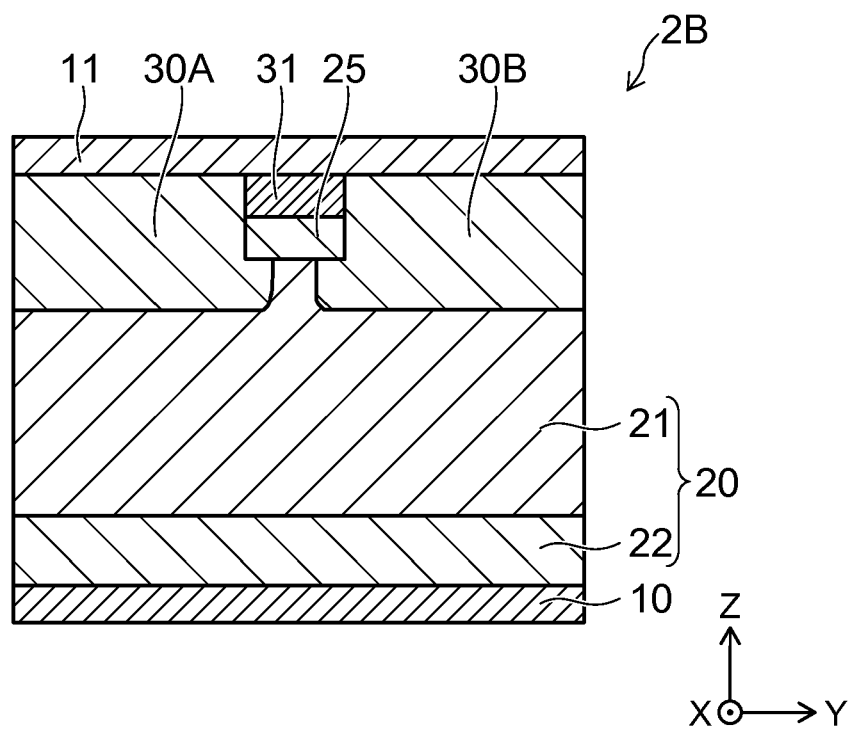
FIG. 7 is a schematic cross-sectional view showing a semiconductor device according to a first variation of the second embodiment.

FIG. 7 is a schematic cross-sectional view showing a semiconductor device according to a first variation of the second embodiment.

The channel regions 21c of a semiconductor device 2B includes an $n^+$-type semiconductor region 25, which has a relatively high impurity concentration. The $n^+$-type semiconductor region 25 is in contact with the $p^+$-type semiconductor region 31. The impurity concentration in the $n^+$-type semiconductor region 25 is higher than the impurity concentration in the n-type semiconductor region 21.

For example, when the impurity diffusion causes the p-type semiconductor region 30A and the p-type semiconductor region 30B to be linked with each other in a manufacturing process, no channel region 21c comes to be formed. In contrast, the semiconductor device 2B is provided with the $n^+$-type semiconductor region 25 between the p-type semiconductor region 30A and the p-type semiconductor region 30B, and the $n^+$-type semiconductor region 25 has a conductivity type opposite the conductivity type of the p-type semiconductor regions. As a result, after the manufacturing process, the p-type semiconductor region 30A and the p-type semiconductor region 30B are more unlikely to be linked with each other.

Further, the impurity concentration in the $n^+$-type semiconductor region 25 is adjusted so that the $n^+$-type semiconductor region 25 is also completely depleted at the time of recovery. As a result, in the semiconductor device 2B, reverse current is reliably suppressed when reverse bias is applied.

Third Embodiment

Figure 8A:
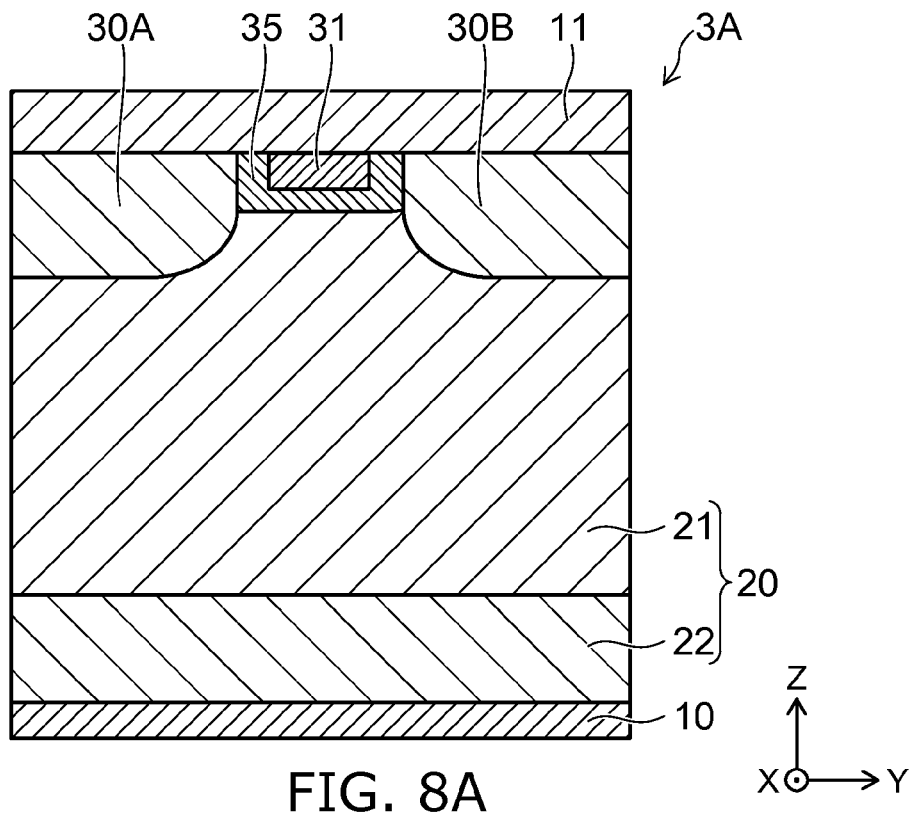
FIG. 8A is a schematic cross-sectional view showing a semiconductor device according to a third embodiment.
Figure 8B:
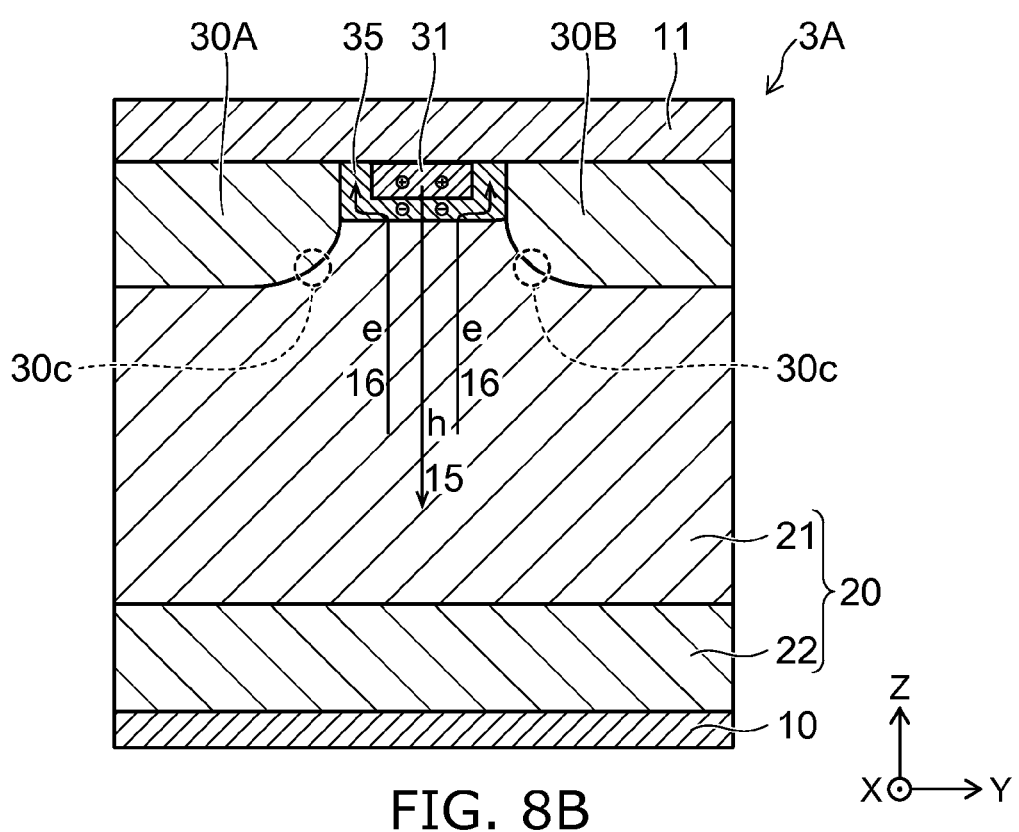
FIG. 8B is a schematic cross-sectional view showing an ON-state operation of the semiconductor device according to the third embodiment.
Figure 9:
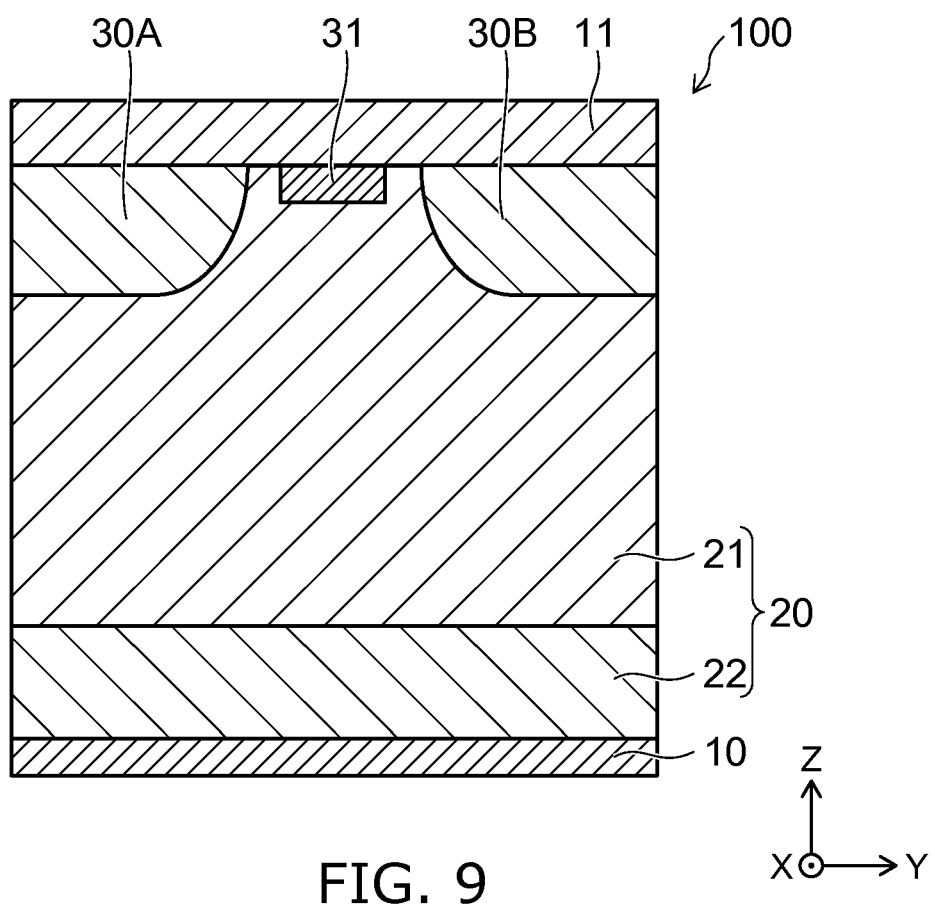
FIG. 9 is a schematic cross-sectional view showing a semiconductor device according to a reference example.

FIG. 8A is a schematic cross-sectional view showing a semiconductor device according to a third embodiment. FIG. 8B is a schematic cross-sectional view showing an ON-state operation of the semiconductor device according to the third embodiment. FIG. 9 is a schematic cross-sectional view showing a semiconductor device according to a reference example.

A semiconductor device 3A shown in FIG. 8A further includes a fifth semiconductor region (for example, $p^-$-type semiconductor region 35 in the following description) between each of the $p^+$-type semiconductor regions 31 and the channel region 21c. The $p^-$-type semiconductor region 35 is provided between the $p^+$-type semiconductor region 31 and the p-type semiconductor region 30A and between the $p^+$-type semiconductor region 31 and the p-type semiconductor region 30B. The $p^-$-type semiconductor region 35 is in contact with the channel region 21c, the p-type semiconductor region 30A, the p-type semiconductor region 30B, and the $p^+$-type semiconductor region 31.

In the semiconductor device 3A, forward-bias voltage is applied between the cathode and the anode in the ON state, as shown in FIG. 8B, as in the embodiments described above.

Most of the electrons (e) move from the $n^+$-type semiconductor region 22 through the n-type semiconductor region 21 and reach immediately under the $p^-$-type semiconductor region 35. That is, the electrons do not exceed the energy barrier between the n-type semiconductor region 21 and the p-type semiconductor regions 30A, 30B but flow through the low-potential channel region 21c toward the anode electrode 11. The electrons are then discharged into the anode electrode 11 via the low-potential p⁻-type semiconductor region 35. That is, electron current 16 is formed between the cathode and the anode.

The junction between the p⁺-type semiconductor region 31, which is a p-type high-concentration region, and the p⁻-type semiconductor region 35 serves as an energy barrier for the electrons (e). The electrons (e), which reach immediately under the p⁺-type semiconductor region 31, are therefore unlikely to flow into the p⁺-type semiconductor region 31. After the electrons (e) reaching immediately under the p⁺-type semiconductor region 31, the electrons (e) move in a lateral direction, that is, in a direction roughly parallel to the Y direction in the portion under the p⁺-type semiconductor region 31. The Y direction in this case includes the +Y direction and the -Y direction.

The movement of the electrons (e) produces a voltage drop under the p⁺-type semiconductor region 31. The voltage drop causes biasing in such a way that the p⁺-type semiconductor region 31, which is in contact with the anode electrode 11, is charged with a positive charge. And the p⁻-type semiconductor region 35, which is positioned under the p⁺-type semiconductor region 31, and the channel region 21c are charged with a negative charge against the p⁺-type semiconductor region 31.

The biasing lowers the energy barrier for the holes between the p⁻-type semiconductor region 35 and the p⁺-type semiconductor region 31. As a result, the holes (h) are injected from the p⁺-type semiconductor region 31 into the p⁻-type semiconductor region 35 and the channel region 21c. The injected holes (h) form hole current 15.

The channel region 21c is completely depleted at the time of recovery, and reverse current is therefore unlikely to flow. Further, the p-type semiconductor regions 30A and 30B have a plurality of corners 30c. Avalanches occur in a scattered manner in the vicinities of the plurality of corners 30c, whereby the amount of breakage resistance of the semiconductor device 3A at the time of recovery increases.

FIG. 9 is a schematic cross-sectional view showing a semiconductor device according to a reference example.

For example, consider a case where the alignment of the p-type semiconductor regions 30A and 30B is insufficient so that the p-type semiconductor regions 30A and 30B are separate from the p⁺-type semiconductor region 31 in the Y direction in a manufacturing process, as in a semiconductor device 100 shown in FIG. 9. In this case, the n-type semiconductor region 21 comes into contact with the anode electrode 11, undesirably resulting in a short circuit between the anode electrode 11 and the cathode electrode 10.

To avoid the situation, the semiconductor device 3A includes the p⁻-type semiconductor region 35 under the p⁺-type semiconductor regions 31. Even when the distance between the p-type semiconductor region 30A and the p-type semiconductor region 30B increases as compared, for example, with the distance in the semiconductor device 1A, the presence of the p⁻-type semiconductor region 35 prevents the n-type semiconductor region 21 from coming into contact with the anode electrode 11. A short circuit between the anode electrode 11 and the cathode electrode 10 is therefore reliably avoided. Further, the presence of the p⁻-type semiconductor region 35 increases the flexibility of the alignment of the p-type semiconductor regions 30A and 30B.

Another Example of Third Embodiment

Figure 10:
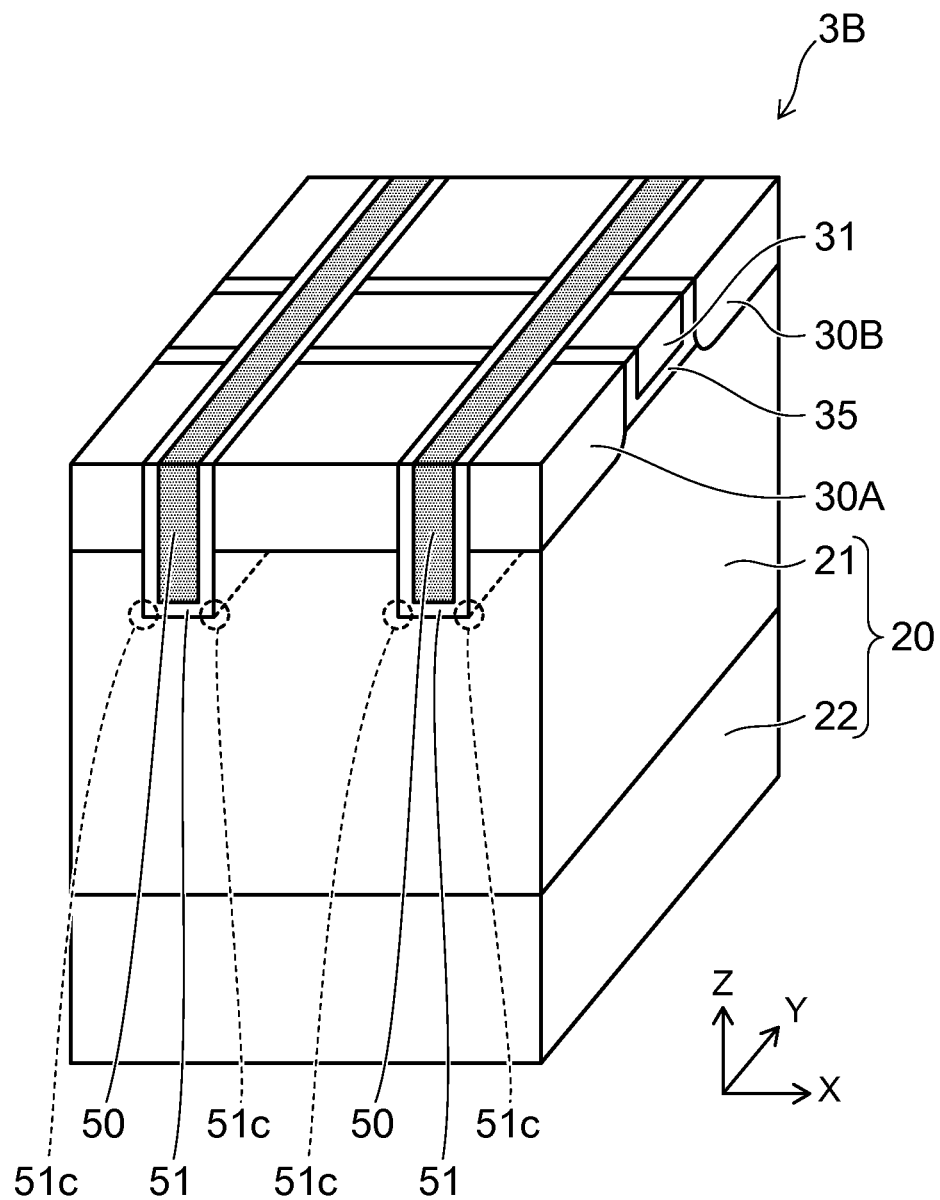
FIG. 10 is a schematic cross-sectional view showing a semiconductor device according to a variation of the third embodiment.

FIG. 10 is a schematic cross-sectional view showing a semiconductor device according to a variation of the third embodiment.

FIG. 10 does not show the cathode electrode 10 or the anode electrode 11.

In a semiconductor device 3B, the p⁻-type semiconductor region 35 is provided between each of the p⁺-type semiconductor regions 31 and the channel region 21c. The connection regions 50 and the insulating films 51 are also provided in the semiconductor device 3B.

In the semiconductor device 3B, in which an avalanche tends to occur not only at each of the plurality of corners 30c but also at each of the plurality of corners 51c, the locations where the avalanche occurs are further scattered across the device, whereby the amount of breakage resistance of the semiconductor device 3B at the time of recovery further increases.

Further, when the semiconductor device 3B is, for example, formed on the same single wafer as a device, such as a MOSFET or an IGBT, the connection regions 50 and the insulating films 51 can be formed simultaneously with the gate electrode and the gate insulating film of the device in a formation process thereof.

Fourth Embodiment

Figure 11A:
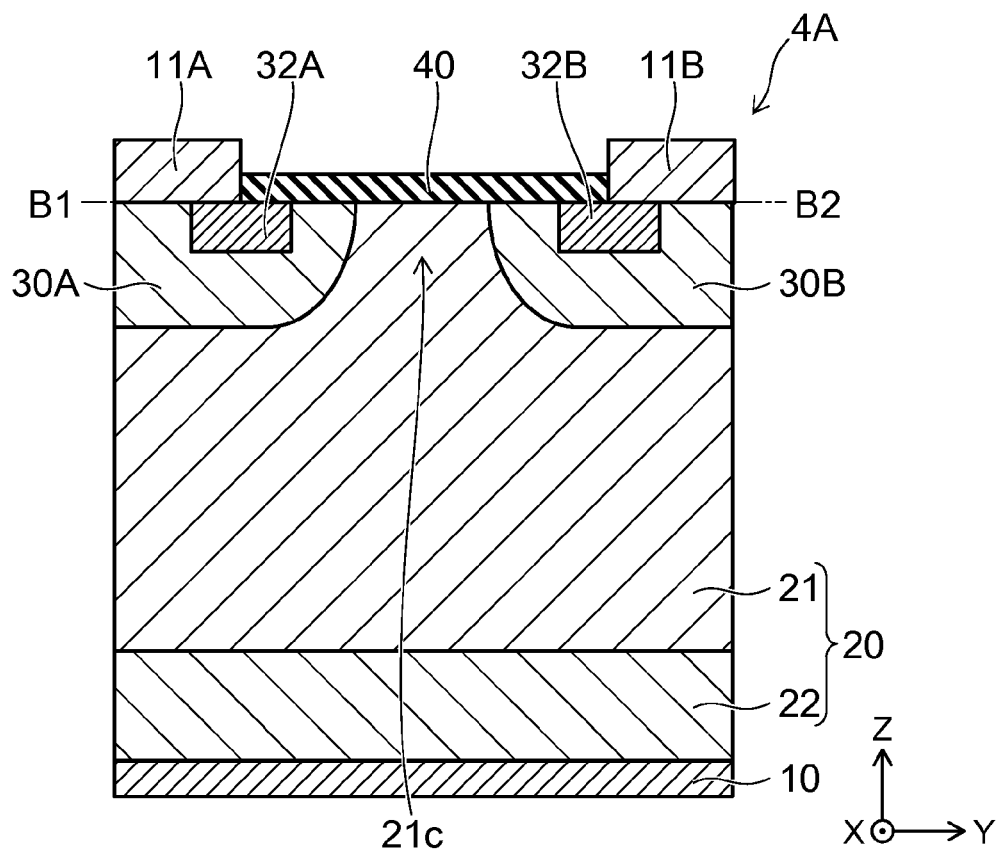
FIG. 11A is a schematic cross-sectional view showing a semiconductor device according to a fourth embodiment.
Figure 11B:
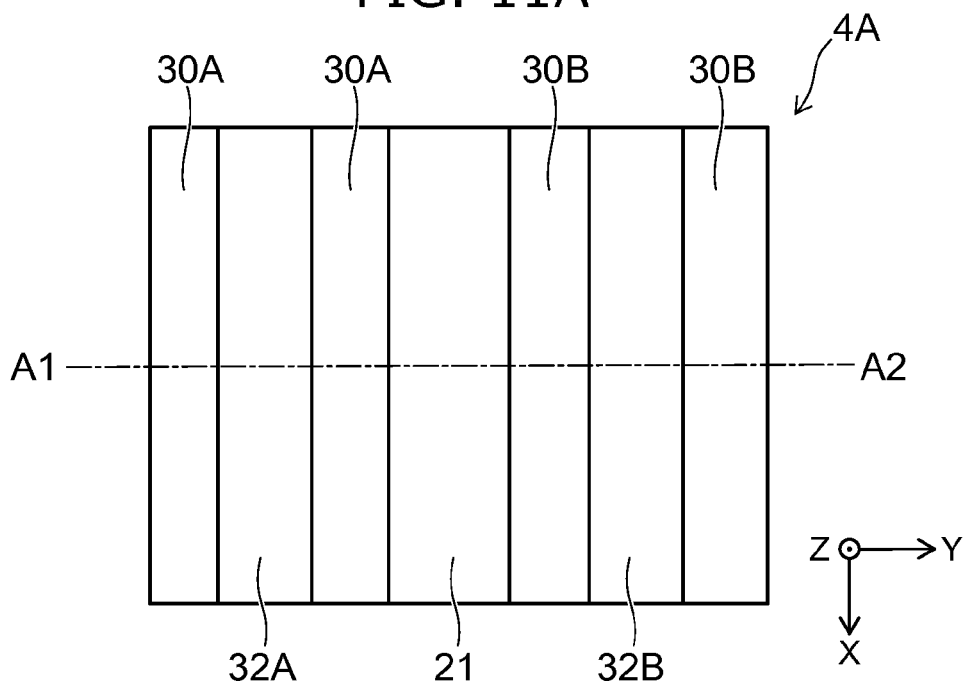
FIG. 11B is a schematic plan view showing the semiconductor device according to the fourth embodiment.

FIG. 11A is a schematic cross-sectional view showing a semiconductor device according to a fourth embodiment. FIG. 11B is a schematic plan view showing the semiconductor device according to the fourth embodiment.

FIG. 11A shows a cross section taken along the line A1-A2 in FIG. 11B. FIG. 11B shows a cross section taken along the line B1-B2 in FIG. 11A and shows a plane of the semiconductor device.

A semiconductor device 4A includes: sixth semiconductor regions (for example, p⁺-type semiconductor regions 32A in the following description); seventh semiconductor regions (for example, p⁺-type semiconductor regions 32B in the following description); and insulating layers 40 on the anode side. The anode electrode 11 of the semiconductor device 4A has a first electrode portion 11A and a second electrode portion 11B. Although not shown, the first electrode portion 11A and the second electrode portion 11B may be in contact with each other above the insulating layers 40.

The insulating layers 40 is provided on the p⁺-type semiconductor regions 32A and 23B and the n-type semiconductor region 21. The insulating layer 40 is provided between the first electrode portion 11A and the second electrode portion 11B.

The semiconductor region 20 is provided between the cathode electrode 10 and the anode electrode 11 and between the cathode electrode 10 and the insulating layer 40. The n⁺-type semiconductor region 22 is connected to the cathode electrode 10.

The p-type semiconductor region 30A is provided between the cathode electrode 10 and the first electrode portion 11A and between the cathode electrode 10 and the insulating layer 40. The p-type semiconductor region 30A is connected to the first electrode portion 11A and the n-type semiconductor region 21.

The p-type semiconductor region 30B is provided between the cathode electrode 10 and the second electrode portion 11B and between the cathode electrode 10 and the insulating layer 40. The p-type semiconductor region 30B is provided beside the p-type semiconductor region 30A in the Y direction. The p-type semiconductor region 30B is connected to the second electrode portion 11B and the n-type semiconductor region 21. In the Y direction, the channel region 21c is located between the p-type semiconductor region 30A and the p-type semiconductor region 30B.

The p+-type semiconductor region 32A is provided between the p-type semiconductor region 30A and the first electrode portion 11A and between the p-type semiconductor region 30A and the insulating layer 40. The p+-type semiconductor region 32A is connected to the first electrode portion 11A. The impurity concentration in the p+-type semiconductor region 32A is higher than the impurity concentration in the p-type semiconductor region 30A.

The p+-type semiconductor region 32B is provided between the p-type semiconductor region 30B and the second electrode portion 11B and between the p-type semiconductor region 30B and the insulating layer 40. The p+-type semiconductor region 32B is connected to the second electrode portion 11B. The impurity concentration in the p+-type semiconductor region 32B is higher than the impurity concentration in the p-type semiconductor region 30B.

Figure 12:
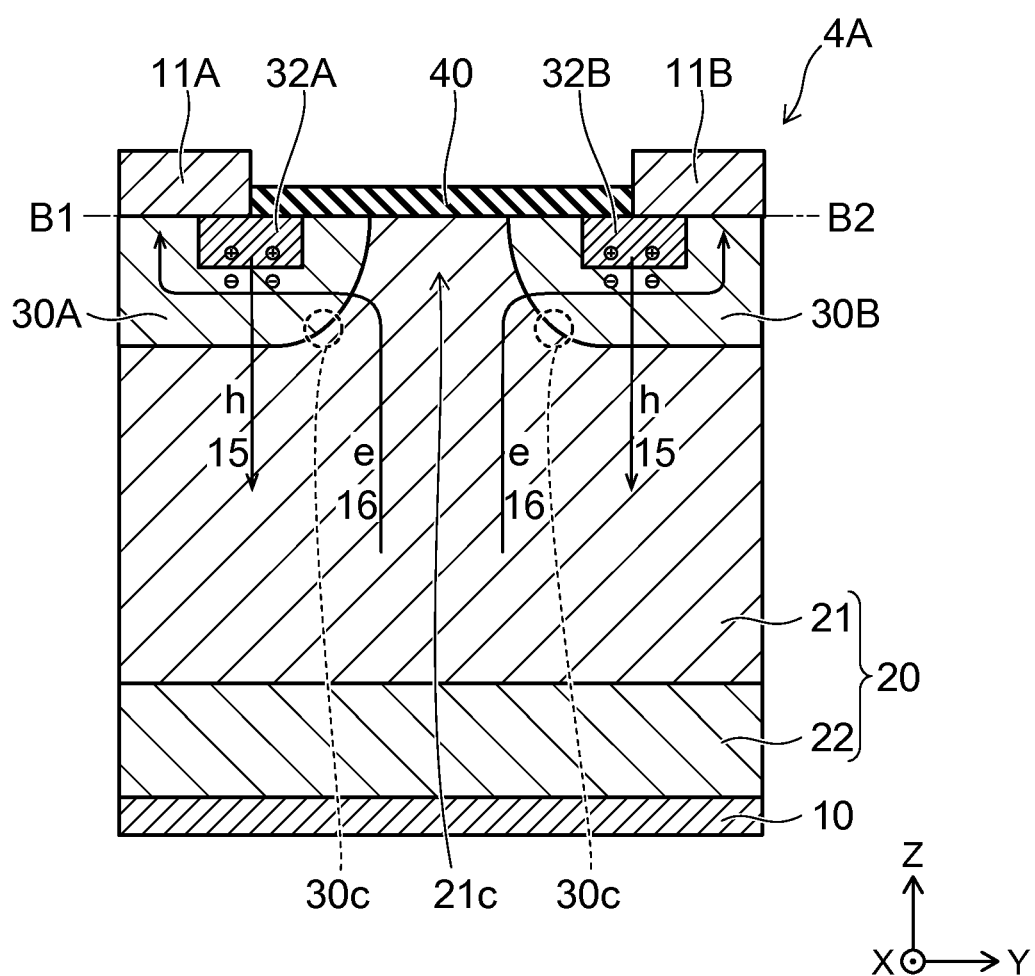
FIG. 12 is a schematic cross-sectional view showing an ON-state operation of the semiconductor device according to the fourth embodiment.

FIG. 12 is a schematic cross-sectional view showing an ON-state operation of the semiconductor device according to the fourth embodiment.

In the semiconductor device 4A, forward-bias voltage is applied between the cathode and the anode in the ON state, as in the embodiments described above. Most of the electrons (e) move from the n+-type semiconductor region 22 through the n-type semiconductor region 21 and reach immediately under the insulating layer 40. That is, the electrons do not exceed the energy barrier between the n-type semiconductor region 21 and the p-type semiconductor regions 30A, 30B but flow through the low-potential channel region 21c toward the anode electrode 11. Electron current 16 is formed between the cathode and the anode.

The junction between the p+-type semiconductor region 32A, which is a p-type high-concentration region, and the p-type semiconductor region 30A and the junction between the p+-type semiconductor region 32B and the p-type semiconductor region 30B serve as energy barriers for the electrons (e). The electrons (e) are therefore unlikely to flow into the p+-type semiconductor region 32A and 32B. After the electrons (e) reach immediately under the p+-type semiconductor regions 32A and 32B, the electrons (e) move in a lateral direction, that is, in a direction roughly parallel to the Y direction in the portions under the p+-type semiconductor regions 32A and 32B. The Y direction in this case includes the +Y direction and the −Y direction.

The movement of the electrons (e) produces a voltage drop under the p+-type semiconductor regions 32A and 32B. The voltage drop causes biasing in such a way that the p+-type semiconductor regions 32A and 32B, which are in contact with the anode electrode 11, are charged with a positive charge and the p-type semiconductor regions 30A and 30B, which are positioned under the p+-type semiconductor regions 32A and 32B, are charged with a negative charge against the p+-type semiconductor regions 32A and 32B.

As a result, the holes (h) are injected from the p+-type semiconductor regions 32A and 32B into the p-type semiconductor regions 30A and 30B and the semiconductor region 20. The injected holes (h) form hole current 15.

The channel region 21c is completely depleted at the time of recovery, and reverse current is therefore unlikely to flow. Further, the p-type semiconductor regions 30A and 30B have a plurality of corners 30c. Avalanches occur in a scattered manner in the vicinities of the plurality of corners 30c, whereby the amount of breakage resistance of the semiconductor device 4A at the time of recovery increases.

Fifth Embodiment

Figure 13A:
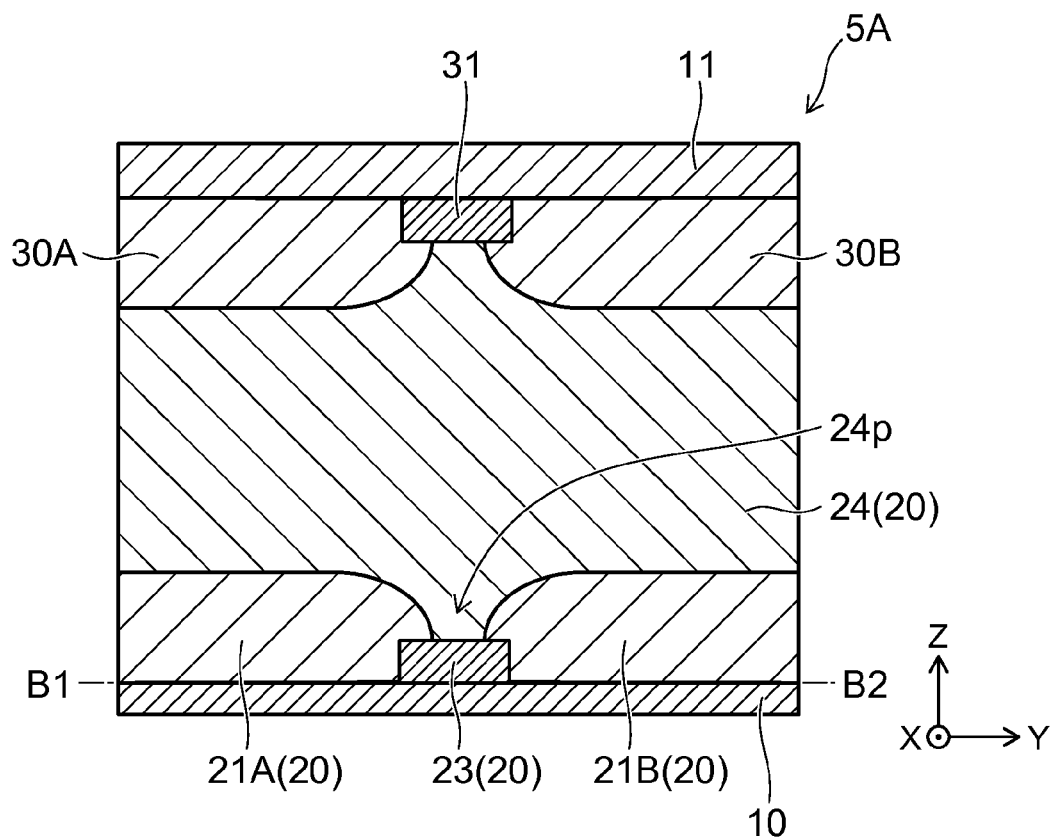
FIG. 13A is a schematic cross-sectional view showing a semiconductor device according to a fifth embodiment.
Figure 13B:
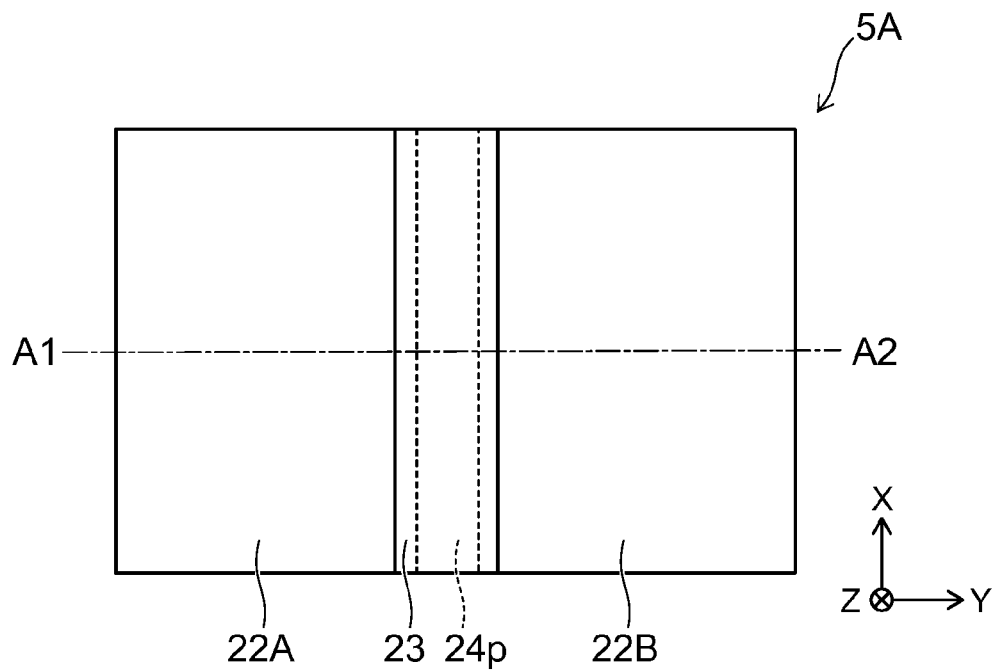
FIG. 13B is a schematic plan view showing the semiconductor device according to the fifth embodiment.

FIG. 13A is a schematic cross-sectional view showing a semiconductor device according to a fifth embodiment. FIG. 13B is a schematic plan view showing the semiconductor device according to the fifth embodiment.

FIG. 13A shows a cross section taken along the line A1-A2 in FIG. 13B. FIG. 13B shows a cross section taken along the line B1-B2 in FIG. 13A and shows a plane of the semiconductor device.

In a semiconductor device 5A, the anode-side structure is, for example, the same as the anode-side structure of the semiconductor device 1A. The anode-side structure of the semiconductor device 5A may be one of the semiconductor devices 1A-4A described above.

In the semiconductor device 5A, the semiconductor region 20 has an n−-type semiconductor region 24, which is a first region, and an n-type semiconductor region 21A, which is a second region, an n-type semiconductor region 21B, which is a third region, and an n+-type semiconductor region 23, which is a fourth region.

The n−-type semiconductor region 24 is in contact with the p-type semiconductor region 30A and the p-type semiconductor region 30B. The n-type semiconductor region 21A is provided between the n−-type semiconductor region 24 and the cathode electrode 10. The n-type semiconductor region 21A is connected to the cathode electrode 10 and the n−-type semiconductor region 24.

The n-type semiconductor region 21B is provided between the n−-type semiconductor region 24 and the cathode electrode 10. The n-type semiconductor region 21B is provided beside the n-type semiconductor region 21A in the Y direction. The n-type semiconductor region 21B is connected to the cathode electrode 10 and the n−-type semiconductor region 24. The n-type semiconductor region 21B and the n-type semiconductor region 21A sandwich a portion 24p of the n−-type semiconductor region 24 in the Y direction. That is, the portion 24p of the n−-type semiconductor region 24 is located between the n-type semiconductor region 21A and the n-type semiconductor region 21B.

The n+-type semiconductor region 23 is provided between the portion 24p of the n−-type semiconductor region 24 and the cathode electrode 10. The n+-type semiconductor region 23 is connected to the cathode electrode 10. The impurity concentration in the n+-type semiconductor region 23 differs from the impurity concentration in the n-type semiconductor region 21A and the impurity concentration in the n-type semiconductor region 21B. For example, the impurity concentration in the n+-type semiconductor region 23 is higher than the impurity concentration in the n-type semiconductor region 21A and the impurity concentration in the n-type semiconductor region 21B.

The distance between the fourth region described above and the anode electrode 11 is greater than the distance between the n-type semiconductor region 21A and the anode electrode 11 and the distance between the n-type semiconductor region 21B and the anode electrode 11. The n+-type semiconductor region 23 is in contact with the n-type semiconductor region 21A and the n-type semiconductor region 21B. The n-type semiconductor region 21A, the n-type semiconductor region 21B, and the n+-type semiconductor region 23 extend in the X direction. The n+-type semiconductor region 23 is positioned under the p+-type semiconductor region 31.

According to the semiconductor device 5A, the area of the junction of the n+-type semiconductor region 23, which is an n-type high-concentration region, and the n−-type semiconductor region 24 is smaller than, for example, the area of the junction of the n+-type semiconductor region 22 and the n-type semiconductor region 21 of the semiconductor device 1A. As a result, in the ON state, injection of the carrier (electrons) from the cathode is suppressed, whereby the recovery period is further shortened.

The connection regions 50 and the insulating layers 51 can be added to any of the semiconductor devices disclosed in the specification.

In the embodiments described above, there is a case that divided regions that is shown in the schematic cross-sectional view are connected each other at an edge of each of the divided regions in a X-Y plane.

In the embodiments described above, "on" in "A is provided on B" means the case where the A contacts the B and the A is provided on the B and the case where the A does not contact the B and the A is provided above the B. "A is provided on B" may include the case where the A and the B are reversed and A is positioned under the B and the case where the A is arranged along with the B.

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first electrode;
   a second electrode;
   a first semiconductor region of a first conductivity type provided between the first electrode and the second electrode;
   a second semiconductor region of a second conductivity type provided between the first semiconductor region and the second electrode;
   a third semiconductor region of the second conductivity type provided between the first semiconductor region and the second electrode, the third semiconductor region being provided beside the second semiconductor region in a second direction crossing a first direction from the first electrode toward the second electrode, and a portion of the first semiconductor region being positioned between the second semiconductor region and the third semiconductor region; and
   a fourth semiconductor region of the second conductivity type provided between the portion of the first semiconductor region and the second electrode, and the fourth semiconductor region having an impurity concentration greater than an impurity concentration in the second semiconductor region and an impurity concentration in the third semiconductor region,
   a distance between the fourth semiconductor region and the first electrode being greater than a distance between the second semiconductor region and the first electrode, the distance between the fourth semiconductor region and the first electrode being greater than a distance between the third semiconductor region and the first electrode, and
   the second semiconductor region, the third semiconductor region and the fourth semiconductor region being in direct contact with the second electrode.

2. The device according to claim 1, wherein the fourth semiconductor region is in contact with the second semiconductor region and the third semiconductor region.

3. The device according to claim 1, wherein the fourth semiconductor region is in contact with the portion of the first semiconductor region, the second semiconductor region, and the third semiconductor region.

4. The device according to claim 1, wherein the impurity concentration on a side of the second electrode is less than the impurity concentration on a side of the first electrode in the second semiconductor region, or the impurity concentration on a side of the second electrode is less than the impurity concentration on a side of the first electrode in the third semiconductor region.

5. The device according to claim 1, wherein the portion of the first semiconductor region includes a region, an impurity concentration is relatively high in the region, and the region is in contact with the fourth semiconductor region.

6. The device according to claim 1, further comprising:
   a fifth semiconductor region of the second conductivity type provided between the fourth semiconductor region and the portion of the first semiconductor region, between the fourth semiconductor region and the second semiconductor region, and between the fourth semiconductor region and the third semiconductor region.

7. The device according to claim 6, wherein an impurity concentration of the fifth semiconductor region is smaller than an impurity concentration in the fourth semiconductor region.

8. The device according to claim 6, wherein an impurity concentration of the fifth semiconductor region is smaller than an impurity concentration in the third semiconductor region.

9. The device according to claim 1, further comprising:
   a fifth semiconductor region of the second conductivity type provided between the fourth semiconductor region and the portion of the first semiconductor region, the fifth semiconductor region being in contact with the portion of the first semiconductor region, the second semiconductor region, the third semiconductor region, and the fourth semiconductor region.

10. The device according to claim 9, further comprising:
    a connection region connected to the second electrode, the connection region facing the first semiconductor region, the second semiconductor region, the third semiconductor region, and the fourth semiconductor region via an insulating film, and the connection region extending in the second direction.

11. The device according to claim 1, further comprising:

a connection region connected to the second electrode, the connection region facing the first semiconductor region, the second semiconductor region, the third semiconductor region, and the fourth semiconductor region via an insulating film, and the connection region extending in the second direction.

12. The device according to claim 11, wherein a distance between the insulating film and the first electrode is less than both of a distance between the second semiconductor region and the first electrode and a distance between the third semiconductor region and the first electrode.

13. The device according to claim 1, wherein the second semiconductor region, the third semiconductor region, and the fourth semiconductor region extend in a third direction crossing the first direction and the second direction.

14. The device according to claim 1, wherein the first semiconductor region includes:

a first region in contact with the second semiconductor region and the third semiconductor region;

a second region provided between the first region and the first electrode;

a third region provided between the first region and the first electrode, the third region being provided beside the second region in the second direction, and a portion of the first region being provided between the second region and the third region; and a fourth region provided between the portion of the first region and the first electrode, and the fourth region having an impurity concentration greater than an impurity concentration in the second region and an impurity concentration in the third region.

15. The device according to claim 14, wherein a distance between the fourth region and the second electrode is greater than both of a distance between the second region and the second electrode and a distance between the third region and the second electrode.

16. The device according to claim 14, wherein the fourth region is in contact with the second region and the third region.

17. The device according to claim 14, wherein the second region, the third region, and the fourth region extend in a third direction crossing the first direction and the second direction.

18. The device according to claim 14, wherein the fourth region is positioned under the fourth semiconductor region.

19. A semiconductor device comprising:

a first electrode;

a second electrode including a first electrode portion and a second electrode portion;

an insulating layer provided between the first electrode portion and the second electrode portion;

a first semiconductor region of a first conductivity type provided between the first electrode and the second electrode and between the first electrode and the insulating layer;

a second semiconductor region of a second conductivity type provided between the first electrode and the first electrode portion and between the first electrode and the insulating layer;

a third semiconductor region provided between the first electrode and the second electrode portion and between the first electrode and the insulating layer, and the third semiconductor region being provided beside the second semiconductor region in a second direction crossing a first direction from the first electrode toward the second electrode, a portion of the first semiconductor region being positioned between the third semiconductor region and the second semiconductor region;

a fourth semiconductor region of the second conductivity type provided between the second semiconductor region and the first electrode portion and between the second semiconductor region and the insulating layer, and the fourth semiconductor region having an impurity concentration greater than an impurity concentration in the second semiconductor region; and a fifth semiconductor region of the second conductivity type provided between the third semiconductor region and the second electrode portion and between the third semiconductor region and the insulating layer, and the fifth semiconductor region having an impurity concentration greater than an impurity concentration in the third semiconductor region, the second semiconductor region and the fourth semiconductor region being in direct contact with the first electrode portion, the third semiconductor region and the fifth semiconductor region being in direct contact with the second electrode portion.

* * * * *